United States Patent
Lan et al.

(10) Patent No.: US 11,610,927 B2
(45) Date of Patent: Mar. 21, 2023

(54) CAPPING STRUCTURE ALONG IMAGE SENSOR ELEMENT TO MITIGATE DAMAGE TO ACTIVE LAYER

(71) Applicant: Taiwan Semiconductor Manufacturing Co., Ltd., Hsin-Chu (TW)

(72) Inventors: Chun-Kai Lan, Hsinchu (TW); Hai-Dang Trinh, Hsinchu (TW); Hsun-Chung Kuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 208 days.

(21) Appl. No.: 16/887,620

(22) Filed: May 29, 2020

(65) Prior Publication Data

US 2021/0273003 A1    Sep. 2, 2021

Related U.S. Application Data

(60) Provisional application No. 62/982,432, filed on Feb. 27, 2020.

(51) Int. Cl.
*H01L 27/146* (2006.01)

(52) U.S. Cl.
CPC .. *H01L 27/14636* (2013.01); *H01L 27/14683* (2013.01)

(58) Field of Classification Search
CPC ......... H01L 27/14636; H01L 27/14683; H01L 27/1462; H01L 27/14689; H01L 27/14621; H01L 27/14627; H01L 27/1463; H01L 27/14649; H01L 27/1464

USPC .......................................................... 257/459
See application file for complete search history.

(56) References Cited

U.S. PATENT DOCUMENTS

| | | | |
|---|---|---|---|
| 8,269,303 B2 * | 9/2012 | Fujikata | G02B 6/12004 257/466 |
| 9,947,713 B2 | 4/2018 | Zhao | |
| 10,204,950 B1 | 2/2019 | Yamashita | |
| 2007/0007556 A1 * | 1/2007 | Shibayama | H01L 31/02161 257/E31.118 |
| 2010/0020734 A1 | 1/2010 | Nakagawa et al. | |
| 2012/0187517 A1 * | 7/2012 | Warashina | H01L 24/01 257/E27.128 |
| 2014/0091418 A1 | 4/2014 | Taguchi et al. | |

(Continued)

FOREIGN PATENT DOCUMENTS

| | | |
|---|---|---|
| CN | 103887360 A | 6/2014 |
| CN | 109727974 A | 5/2019 |

*Primary Examiner* — Dao H Nguyen
(74) *Attorney, Agent, or Firm* — Eschweiler & Potashnik, LLC

(57) ABSTRACT

Various embodiments of the present disclosure are directed towards an image sensor. The image sensor includes and image sensor element disposed within a substrate. The substrate comprises a first material. The image sensor element includes an active layer comprising a second material different from the first material. A buffer layer is disposed between the active layer and the substrate. The buffer layer extends along outer sidewalls and a bottom surface of the active layer. A capping structure overlies the active layer. Outer sidewalls of the active layer are spaced laterally between outer sidewalls of the capping structure such that the capping structure continuously extends over outer edges of the active layer.

20 Claims, 13 Drawing Sheets

(56) References Cited

U.S. PATENT DOCUMENTS

| | | |
|---|---|---|
| 2015/0024221 A1 | 1/2015 | Watanabe et al. |
| 2018/0190707 A1 | 7/2018 | Lee et al. |
| 2020/0105812 A1* | 4/2020 | Sze .................. H01L 27/14689 |
| 2021/0091239 A1* | 3/2021 | Chern .................. H01L 31/028 |
| 2022/0037552 A1* | 2/2022 | Liao .................... H01L 31/0288 |

* cited by examiner

CAPPING STRUCTURE ALONG IMAGE SENSOR ELEMENT TO MITIGATE DAMAGE TO ACTIVE LAYER

REFERENCE TO RELATED APPLICATION

This Application claims the benefit of U.S. Provisional Application No. 62/982,432, filed on Feb. 27, 2020, the contents of which are hereby incorporated by reference in their entirety.

BACKGROUND

Integrated circuits (IC) with image sensors are used in a wide range of modern day electronic devices. In recent years, complementary metal-oxide semiconductor (CMOS) image sensors (CISs) have begun to see widespread use, largely replacing charge-coupled devices (CCD) image sensors. Compared to CCD image sensors, CISs are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
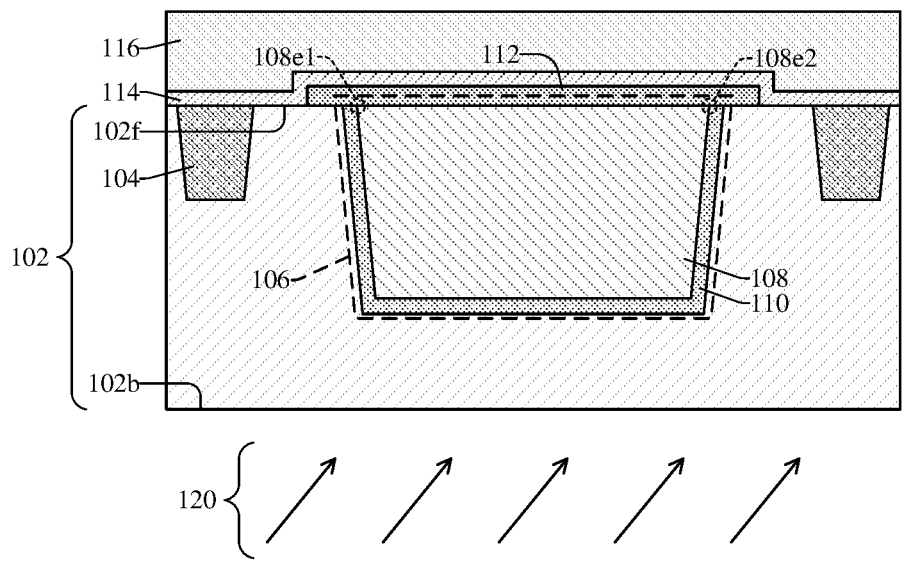
FIG. 1 illustrates a cross-sectional view of some embodiments of an image sensor including a capping structure continuously extending over outer edges of an image sensor element.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise an array of pixel regions, which respectively have an image sensor element arranged within a semiconductor substrate. Upon receiving incident radiation, the image sensor element is configured to generate electric signals corresponding to the received incident radiation. The electric signals from the image sensor element can be processed by a signal processing unit. The semiconductor substrate may comprise a first material (e.g., silicon) and the image sensor element may include an active layer that comprises a second material (e.g., germanium) that is different from the first material. The active layer is disposed within the semiconductor substrate. Further, the second material may be selected to enhance absorption of incident electromagnetic radiation within a first range of wavelengths (e.g., the first range of wavelengths comprises infrared (IR) radiation). This may increase an ability for the image sensor element to preform depth detection and/or phase detection. The increased ability to capture incident electromagnetic radiation within the first range of wavelengths increases performance of the image sensor element in time of flight (TOF) applications.

One challenge with the above CIS is damage of the active layer during fabrication of the image sensor element. For example, fabrication of the CIS may include forming a trench within a semiconductor substrate and subsequently forming a buffer layer that lines the trench. An active layer is deposited over the buffer layer and fills the trench, and a planarization process (e.g., a chemical mechanical planarization (CMP) process) is performed into the active layer. A capping structure is formed over the active layer, such that outer sidewalls of the capping structure are aligned with and/or spaced laterally between outer sidewalls of the active layer. An upper dielectric layer is formed over the capping structure and the semiconductor substrate. Further, one or more silicide layers may be formed in the capping structure and/or the semiconductor substrate. Forming the one or more silicide layers may include depositing a conductive layer (e.g., comprising nickel) over the capping structure and/or the semiconductor substrate and performing an annealing layer to form the one or more silicide layers. Subsequently, a removal process (e.g., a wet etch process) is performed on the semiconductor substrate to remove remaining portions of the conductive layer that did not form into silicide. The removal process includes exposing the semiconductor substrate to one or more etchants (e.g., hydrogen peroxide (e.g., $H_2O_2$)). The one or more etchants may damage the active layer by penetrating a seam located at an upper edge of the active layer. The seam is located at an interface between the dielectric layer and the active layer. This may result in the formation of a void in the active layer and/or damage to the active layer, thereby decreasing performance of the image sensor element.

Accordingly some embodiments of the present disclosure are directed towards an image sensor comprising a capping structure overlying an active layer, and an associated method for forming the image sensor. For example, a method for forming the image sensor may include forming a trench within a semiconductor substrate and subsequently forming a buffer layer that lines the trench. An active layer is deposited over the buffer layer and fills the trench, and a planarization process (e.g., a chemical mechanical planarization (CMP) process) is performed into the active layer. A capping structure is formed over the active layer, such that outer sidewalls of the active layer are spaced laterally between outer sidewalls of the capping structure. Thus, a width of the capping structure is greater than a width of the active layer and the capping structure directly covers and continuously extends over outer edges of the active layer. An upper dielectric layer is formed over the capping structure and the semiconductor substrate. Further, one or more silicide layers may be formed in the capping structure and/or the semiconductor substrate. Subsequently, a removal process (e.g., a wet etch process) is performed on the semiconductor substrate (e.g., to remove remaining portions of a conductive layer that did not form into silicide). The removal process includes exposing the semiconductor substrate to one or more etchants (e.g., hydrogen peroxide (e.g., $H_2O_2$)). By virtue of the capping structure covering outer edges of the active layer, the one or more etchants may be impeded from reaching the active layer during the removal process. This, in turn, mitigates the one or more etchants damaging the active layer, thereby increasing performance of the image sensor.

FIG. 1 illustrates a cross-sectional view of some embodiments of an image sensor 100 including a capping structure 112 continuously extending over outer edges 108e1, 108e2 of an active layer 108.

The image sensor 100 includes a dielectric structure 116 overlying a substrate 102. An image sensor element 106 is disposed within the substrate 102. The image sensor element 106 is configured to convert electromagnetic radiation 120 (e.g., photons) into electrical signals (i.e., to generate electron-hole pairs from the electromagnetic radiation 120). The electromagnetic radiation 120 may be disposed on a back-side surface 102b of the substrate. Thus, in some embodiments, the electromagnetic radiation 120 is back-side illuminated (BSI) upon the image sensor 100. In some embodiments, the image sensor element 106 may, for example, be configured to generate electrical signals from infrared (IR) radiation (e.g., electromagnetic radiation with wavelengths in a range of about 800 nanometers (nm) to 2,500 nm).

In some embodiments, the substrate 102 is comprised of a first material (e.g., silicon). Further, the image sensor element 106 comprises the active layer 108 that is disposed within a recess of the substrate 102 and a buffer layer 110 disposed between the active layer 108 and the substrate 102. In further embodiments, the active layer 108 comprises a second material (e.g. germanium) that is different from the first material. In yet further embodiments, the buffer layer 110 comprises a combination of the first material and the second material and provides a transition region between the substrate 102 and the active layer 108. A first isolation structure 104 is disposed within the substrate 102 and provides electrical isolation to the image sensor element 106 from other devices and/or doped regions (not shown) disposed within/on the substrate 102. The first isolation structure 104 may laterally enclose the image sensor element 106. The active layer 108 may, for example, comprise photodetector regions and/or layers such as charge storage region(s), floating node(s), surface pinning region(s), contact region(s), guard ring(s), etc. (not shown) configured to convert the electromagnetic radiation 120 (e.g., photons) into electrical signals and/or facilitate readout of the electrical signals. In some embodiments, the second material (e.g., germanium) of the active layer 108 is selected to ensure high quantum efficiency (QE) for IR radiation by the image sensor element 106, thereby increasing a performance of the image sensor 100.

The capping structure 112 overlies a front-side surface 102f of the substrate 102 and continuously extends over a top surface of the active layer 108 and a top surface of the buffer layer 110. A dielectric layer 114 overlies the front-side surface 102f of the substrate 102 and the capping structure 112. The dielectric structure 116 overlies the dielectric layer 114. In further embodiments, a thickness of the capping structure 112 is greater than a thickness of the dielectric layer 114. In some embodiments, the capping structure 112 may, for example, be or comprise the first material (e.g., silicon), epitaxial silicon, amorphous silicon, crystalline silicon, a high-k dielectric material such as aluminum oxide, hafnium oxide, another suitable material, or any combination of the foregoing. Further, the capping structure 112 continuously extends over the opposing sidewalls of the image sensor element 106. Thus, the capping structure 112 directly covers and overlies the outer edges 108e1, 108e2 of the active layer 108. In yet further embodiments, a maximum width of the capping structure 112 is greater than a maximum width of the image sensor element 106.

In some embodiments, during fabrication of the image sensor 100, a silicide layer (not shown) may be formed within the capping structure 112 to facilitate an electrical connection between a conductive contact (not shown) and the photodetector regions and/or layers (not shown) disposed within the active layer 108. Forming the silicide layer may include depositing a conductive layer (e.g., comprising nickel) over the capping structure 112 and performing an annealing process to form the silicide layer (e.g., comprising nickel silicide (NiSi)) within the capping structure 112. Subsequently, a removal process (e.g., a wet etch process) is performed on the capping structure 112 to remove excess material from the conductive layer that did not convert into the silicide layer. The removal process includes exposing the substrate 102 and the capping structure 112 to one or more etchants (e.g., hydrogen peroxide (e.g., $H_2O_2$)). By virtue of the capping structure 112 covering outer edges 108e1, 108e2 of the active layer 108, the one or more etchants may not reach and/or react with the active layer 108 during the removal process. This, in turn, mitigates damage to the active layer 108 by the one or more etchants, thereby increasing performance of the image sensor 100. In yet further embodiments, another silicide layer (not shown) may be formed within the substrate 102, such that the capping structure 112 protects the active layer during formation of the another silicide layer.

Figure 2A:
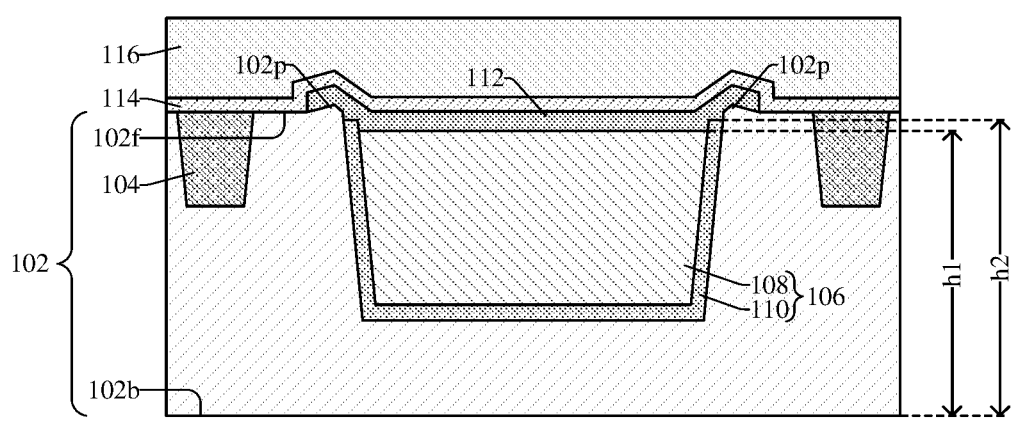
FIGS. 2A-2E illustrate cross-sectional views of some embodiments of image sensors according to some alternative embodiments of the image sensor of FIG. 1.

FIG. 2A illustrates a cross-sectional view of an image sensor 200a according to some alternative embodiments of the image sensor 100 of FIG. 1.

In some embodiments, the image sensor 200a includes the substrate 102, where the substrate 102 comprises protrusions 102p disposed laterally adjacent to the image sensor element

106. A top surface of the protrusions 102*p* is vertically above a top surface of the image sensor element 106. In further embodiments, the capping structure 112 and the dielectric layer 114 overlie the protrusions 102*p* and conform to a shape of the protrusions 102*p*. A height h1 of the active layer 108 is defined between the back-side surface 102*b* of the substrate 102 and a top surface of the active layer 108, and a height h2 of the buffer layer 110 is defined between the back-side surface 102*b* of the substrate 102 and a top surface of the buffer layer 110. In some embodiments, the height h1 is less than the height h2.

Figure 2B:
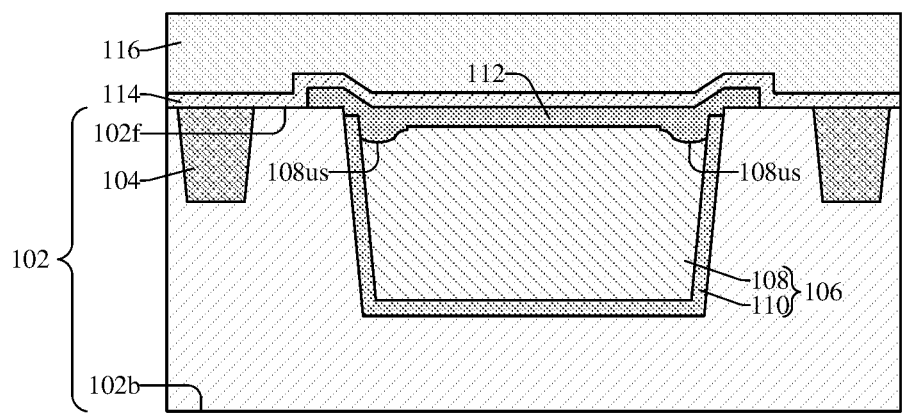

FIG. 2B illustrates a cross-sectional view of an image sensor 200*b* according to some alternative embodiments of the image sensor 200*a* of FIG. 2A.

In some embodiments, the image sensor 200*b* includes the capping structure 112 overlying the active layer 108. The active layer 108 comprises a curved upper surface 108*us* such that the capping structure 112 comprises protrusions that contact the curved upper surface 108*us* of the active layer 108. The curved upper surface 108*us* of the active layer 108 is disposed below a top surface of the active layer 108.

Figure 2C:
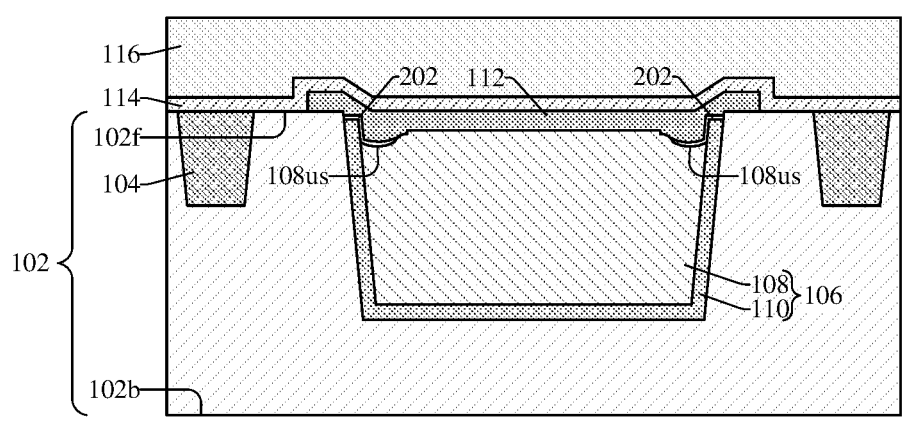

FIG. 2C illustrates a cross-sectional view of an image sensor 200*c* according to some alternative embodiments of the image sensor 200*a* of FIG. 2A.

In some embodiments, the image sensor 200*c* includes an oxide layer 202 disposed between a portion of the active layer 108 and the capping structure 112. Further, the oxide layer 202 is disposed between the buffer layer 110 and the capping structure 112. In some embodiments, the oxide layer 202 may, for example, be or comprise an oxide of the second material, such as germanium oxide (e.g., $GeO_2$), or another material. The oxide layer 202 may extend from a top surface of the buffer layer 110, along a sidewall of the buffer layer 110, to the curved upper surface 108*us* of the active layer 108.

Figure 2D:
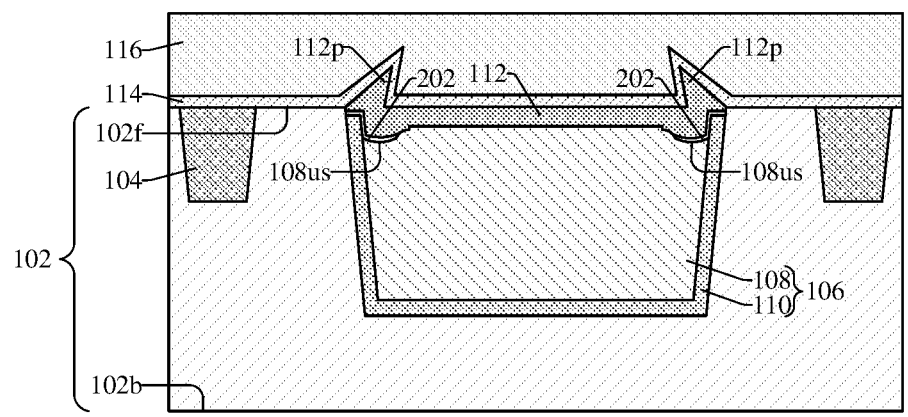

FIG. 2D illustrates a cross-sectional view of an image sensor 200*d* according to some alternative embodiments of the image sensor 200*a* of FIG. 2A.

The image sensor 200*d* includes the capping structure 112 overlying the active layer 108. In some embodiments, the capping structure 112 comprises a plurality of protrusions 112*p*, where the protrusions 112*p* each overlie an edge and/or sidewall of the active layer 108. The dielectric layer 114 continuously extends along the protrusions 112*p* of the capping structure 112. The protrusions 112*p* may directly overlie the oxide layer 202. In yet further embodiments, the oxide layer 202 may be omitted (not shown).

Figure 2E:
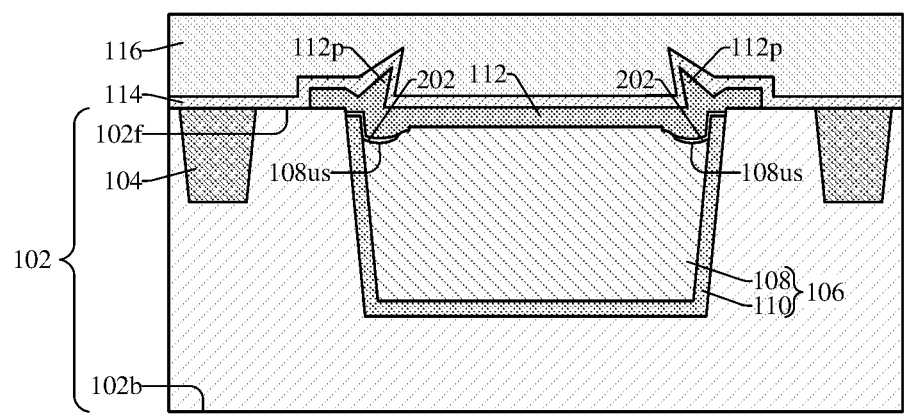

FIG. 2E illustrates a cross-sectional view of an image sensor 200*e* according to some alternative embodiments of the image sensor 200*d* of FIG. 2D, where outer sidewalls of the capping structure 112 are laterally offset from sidewalls of the image sensor element 106 by one or more non-zero distances. Thus, in some embodiments, a width of the capping structure 112 is greater than a width of the image sensor element 106. In yet further embodiments, the oxide layer 202 may be omitted (not shown).

Figure 3A:
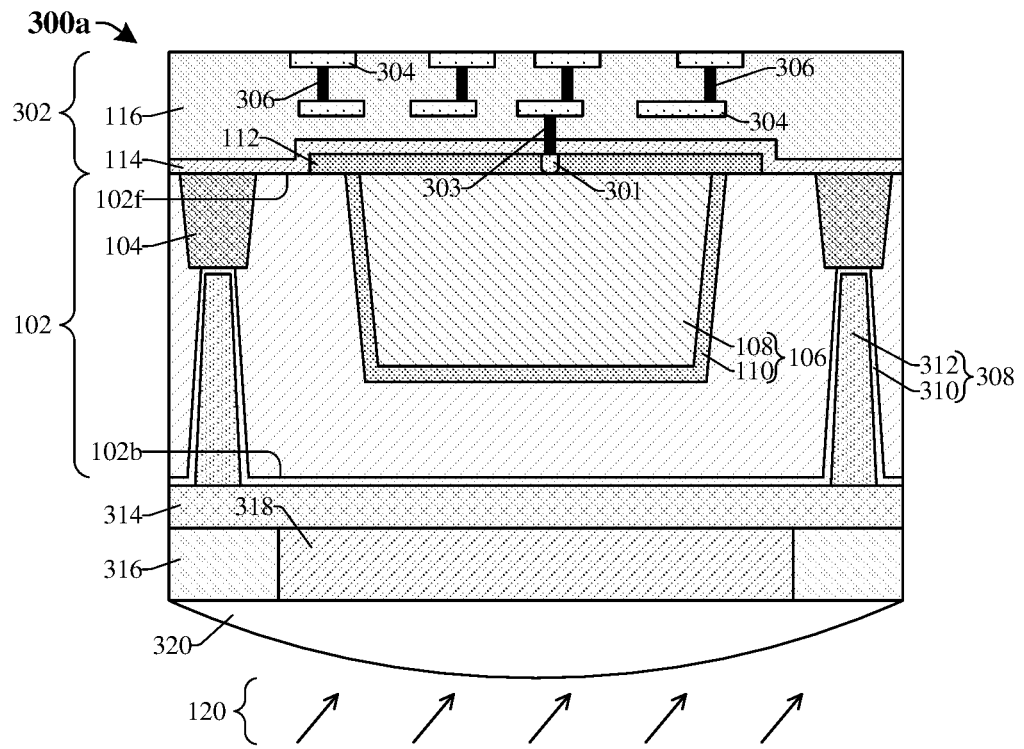
FIGS. 3A-3B illustrate cross-sectional views of some embodiments of an integrated chip comprising an interconnect structure over a substrate, where a capping structure continuously extends over a top surface of an image sensor element.

FIG. 3A illustrates a cross-sectional view of some embodiments of an integrated chip 300*a* including an interconnect structure 302 overlying a substrate 102.

The interconnect structure 302 is disposed along the front-side surface 102*f* of the substrate 102 and an anti-reflective coating (ARC) structure 314 is disposed along the back-side surface 102*b* of the substrate 102. In some embodiments, the substrate 102 may, for example, be or comprise a bulk substrate (e.g., a bulk silicon substrate), a silicon-on-insulator (SOI) substrate, crystalline silicon, P-doped silicon, or another suitable material. Thus, the substrate 102 may comprise a first material such as, for example, silicon. The interconnect structure 302 comprises the dielectric structure 116, a conductive contact 303, a plurality of conductive vias 306, and a plurality of conductive wires 304. In some embodiments, the interconnect structure 302 may, for example, be or comprise silicon dioxide, a low-k dielectric material, an extreme low-k dielectric material, another material, or any combination of the foregoing. In yet further embodiments, the conductive contact 303, the plurality of conductive vias 306, and/or the plurality of conductive wires 304 may, for example, respectively be or comprise aluminum, copper, ruthenium, tungsten, titanium nitride, tantalum nitride, another suitable material, or any combination of the foregoing. The interconnect structure 302 is configured to electrically couple doped regions and/or semiconductor devices disposed within the integrated chip 300*a* to one another. Further, the dielectric layer 114 is disposed between the substrate 102 and the dielectric structure 116. In some embodiments, the dielectric layer 114 may, for example, be or comprise an oxide, such as silicon dioxide, another suitable material, or any combination of the foregoing.

An image sensor element 106 is disposed within the substrate 102 and comprises an active layer 108 and a buffer layer 110. The buffer layer 110 is disposed between the active layer 108 and the substrate 102. The image sensor element 106 is, for example, configured to generate electrical signals from infrared (IR) radiation (e.g., electromagnetic radiation with wavelengths in a range of about 700 nanometers (nm) to about 2,500 nm). It will be appreciated that the image sensor element 106 being configured to generate electrical signals from other frequency wavelength values is also within the scope of the disclosure. In some embodiments, the active layer 108 may, for example, be or comprise a second material, such as germanium, or another suitable material. In further embodiments, the buffer layer 110 is comprised of the first material (e.g., silicon) and the second material (e.g., germanium) such that a concentration of the first material continuously decreases from an inner surface of the substrate 102 to an outer surface of the active layer 108 and a concentration of the second material continuously increases from the inner surface of the substrate 102 to the outer surface of the active layer 108.

A first isolation structure 104 is disposed within the substrate 102 and laterally encloses the image sensor element 106. The first isolation structure 104 extends from the front-side surface 102*f* of the substrate 102 to a point below the front-side surface 102*f* of the substrate 102. The first isolation structure 104 is configured to electrically isolate the image sensor element 106 from other devices disposed on and/or within the substrate 102. In some embodiments, the first isolation structure 104 is configured as a shallow trench isolation (STI) structure or another suitable isolation structure. In further embodiments, the first isolation structure 104 may, for example, be or comprise an oxide, such as silicon dioxide, silicon nitride, silicon carbide, silicon oxynitride, silicon oxycarbide, another dielectric material, or any combination of the foregoing.

Further, a capping structure 112 overlies the front-side surface 102*f* of the substrate 102 and is disposed between the image sensor element 106 and the dielectric layer 114. Outer sidewalls of the image sensor element 106 are spaced laterally between sidewalls of the capping structure 112. Thus, the capping structure 112 continuously extends over a top surface of the active layer 108 and the buffer layer 110. In some embodiments, the capping structure 112 may, for example, be or comprise the first material (e.g., silicon), epitaxial silicon, amorphous silicon, crystalline silicon, a high-k dielectric material such as aluminum oxide, hafnium oxide, another suitable material, or any combination of the foregoing. The capping structure 112 is configured to protect the active layer 108 from one or more etchants utilized during fabrication of the integrated chip 300a, thereby increasing a reliability, endurance, and performance of the image sensor element 106. Further, a silicide layer 301 is disposed within the capping structure 112. The silicide layer 301 is configured to electrically couple the conductive contact 303 to photodetector regions and/or layers (not shown) disposed within the active layer 108. In some embodiments, the silicide layer 301 may, for example, be or comprise nickel silicide, titanium silicide, another material, or any combination of the foregoing. In yet further embodiments, a thickness of the silicide layer 301 may be equal to a thickness of the capping structure 112.

A second isolation structure 308 extends from the back-side surface 102b of the substrate 102 to a point above the back-side surface 102b of the substrate 102. In some embodiments, a top surface of the second isolation structure 308 may contact a bottom surface of the first isolation structure 104. The second isolation structure 308 laterally surrounds the image sensor element 106 and is configured to electrically isolate the image sensor element 106 from other devices disposed within and/or on the substrate 102. In some embodiments, the second isolation structure 308 is configured as a deep trench isolation (DTI) structure or another suitable isolation structure. The second isolation structure 308 includes a passivation layer 310 and a trench layer 312. In some embodiments, the passivation layer 310 may, for example, be or comprise a dielectric material, such as silicon dioxide, silicon oxynitride, silicon oxycarbide, another material, or any combination of the foregoing. Further, the passivation layer 310 may continuously extend along the back-side surface 102b of the substrate 102. The passivation layer 310 is disposed between the substrate 102 and the trench layer 312. In some embodiments, the trench layer 312 may, for example, be or comprise aluminum, tungsten, copper, another material, or any combination of the foregoing. In further embodiments, the second isolation structure 308 may be configured to direct electromagnetic radiation 120 towards the image sensor element 106. In such embodiments, the electromagnetic radiation 120 may reflect off of sidewalls of the trench layer 312 to the image sensor element 106 instead of the electromagnetic radiation 120 traveling to an adjacent image sensor element (not shown). In such embodiments, the second isolation structure 308 may decrease cross-talk between adjacent image sensor elements, thereby increase a performance of the integrated chip 300a.

The ARC structure 314 is disposed along the back-side surface 102b of the substrate 102 and is configured to decrease reflection of the electromagnetic radiation 120 away from the substrate 102, thereby increasing a performance of the integrated chip 300a. A grid structure 316 underlies the ARC structure 314. The grid structure 316 may, for example, comprise a metal grid structure and/or a dielectric grid structure. The grid structure 316 is configured to direct the electromagnetic radiation 120 to the image sensor element 106. In some embodiments, when the grid structure 316 comprises the metal grid structure (e.g., aluminum, copper, tungsten, another material, or any combination of the foregoing), electromagnetic radiation 120 may reflect off of sidewalls of the metal grid structure to the image sensor element 106 instead of traveling to an adjacent image sensor element (not shown). In such embodiments, the grid structure 316 may decrease cross-talk between adjacent image sensor elements, thereby increasing a performance of the integrated chip 300a.

In addition, a light filter 318 (e.g., a color filter, an IR filter, etc.) underlies the ARC structure 314 and is disposed laterally between sidewalls of the grid structure 316. The light filter 318 is configured to transmit specific wavelengths of incident radiation. For example, the light filter 318 may transmit radiation having wavelengths within a first range while blocking radiation having wavelengths within a second range that is different from the first range. Further, a micro-lens 320 is disposed under the light filter 318 and the grid structure 316. The micro-lens 320 is configured to focus the electromagnetic radiation 120 towards the substrate 102, thereby increasing the QE of the image sensor element 106.

Figure 3B:
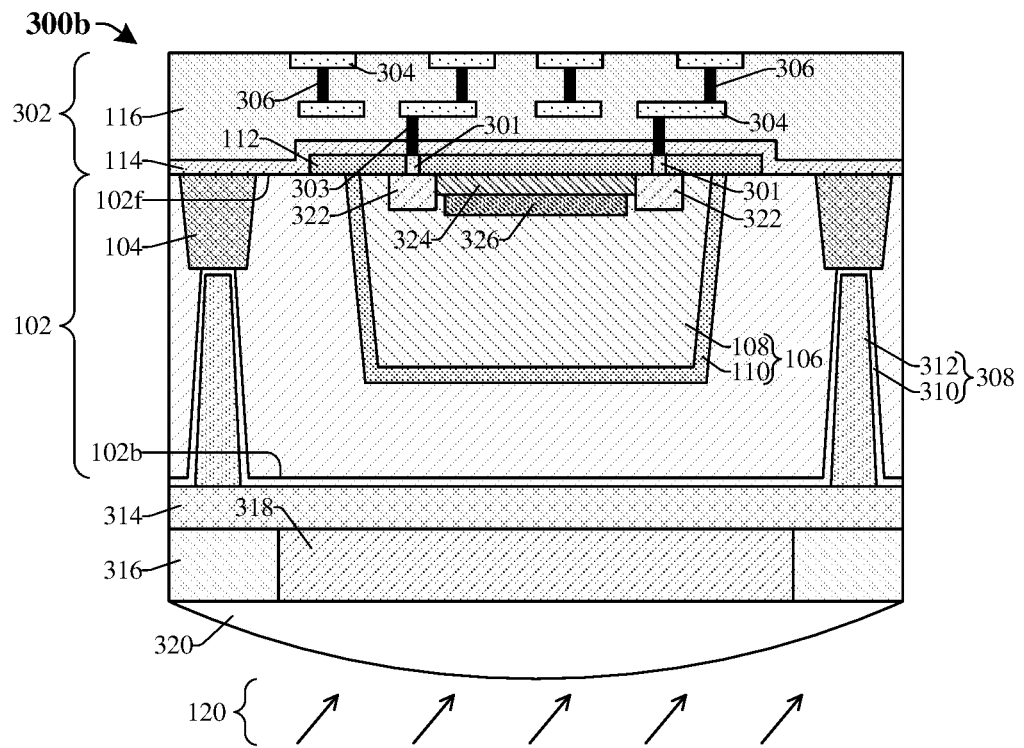

FIG. 3B illustrates a cross-sectional view of some embodiments of an integrated chip 300b corresponding to some alternative embodiments of the integrated chip 300a of FIG. 3A.

The substrate 102 may, for example, be a bulk substrate (e.g., a bulk silicon substrate), a silicon-on-insulator (SOI) substrate, P-doped silicon, N-doped silicon, or another suitable material. In some embodiments, the substrate 102 is lightly doped with dopants of a first conductivity type (e.g., p-type). In various embodiments, the image sensor element 106 is configured as a single photon avalanche diode (SPAD) which can detect incident radiation with very low intensities (e.g., a single photon). In further embodiments, the image sensor element 106 may, for example, be used in an IR direct-time of flight (D-TOF) application. In some embodiments, the active layer 108 is lightly doped with dopants of the first conductivity type (e.g., p-type). In further embodiments, the active layer 108 comprises a first deep well 326 of the first conductivity type and a first heavily doped region 324 of a second conductivity type (e.g., n-type) opposite to the first conductivity type. The first deep well 326 is disposed below the first heavily doped region 324. A multiplication junction region is formed at an interface between the first heavily doped region 324 and the first deep well 326. In some embodiments, the first deep well 326 is vertically spaced from the first heavily doped region 324 (not shown) such that the multiplication junction region is formed at an interface between the first heavily doped region 324 and the active layer 108.

In some embodiments, the image sensor element 106 further comprises a second deep well 322 heavily doped with dopants of the first conductivity type. The second deep well 322 extends from the front-side surface 102f of the substrate 102 to a point below the first heavily doped region 324. The second deep well 322 may be configured as a guard ring to prevent premature edge breakdown of the image sensor element 106 in the SPAD configuration. Further, the buffer layer 110 is disposed between the active layer 108 and the substrate 102. The buffer layer 110 may comprise the same dopants and doping concentration as the active layer 108. In some embodiments, the buffer layer 110 may be omitted such that the active layer 108 directly contacts the substrate 102 (not shown). In some embodiments, dopants of the first conductivity type are P-type (e.g., boron, some other suitable P-type dopants, or any combination of the foregoing) and dopants of the second conductivity type are N-type (e.g., arsenic, phosphorus, some other suitable N-type dopants, or any combination of the foregoing), or vice versa.

In some embodiments, during operation in the SPAD configuration, the image sensor element 106 is reverse biased above its breakdown voltage, and incident photons (e.g., wavelengths within the range of IR radiation) strike the image sensor element 106 to generate charge carriers. The photon-generated charge carriers move to the multiplication region and trigger an avalanche current that amplifies the signals generated by the photons so that they are easier to detect. In some embodiments, a doping type and/or concentration of the first deep well 326 can be configured to adjust the breakdown voltage of the image sensor element 106 in the SPAD configuration. A plurality of conductive contacts 303 directly overlie the image sensor element 106 and are electrically coupled to the doped regions within the active layer 108 to facilitate readout of signals generated by the photons. Further, a plurality of silicide layers 301 are disposed within the capping structure 112 between the active layer 108 and the plurality of conductive contacts 303. The silicide layers 301 are configured to facilitate an electrical connection between the doped regions within the active layer 108 and the conductive contacts 303.

FIGS. 4-14 illustrate cross-sectional views 400-1400 of some embodiments of a first method of forming an integrated chip having a capping structure that continuously extends over outer edges of an image sensor element according to the present disclosure. Although the cross-sectional views 400-1400 shown in FIGS. 4-14 are described with reference to a first method, it will be appreciated that the structures shown in FIGS. 4-14 are not limited to the first method but rather may stand alone separate of the first method. Furthermore, although FIGS. 4-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
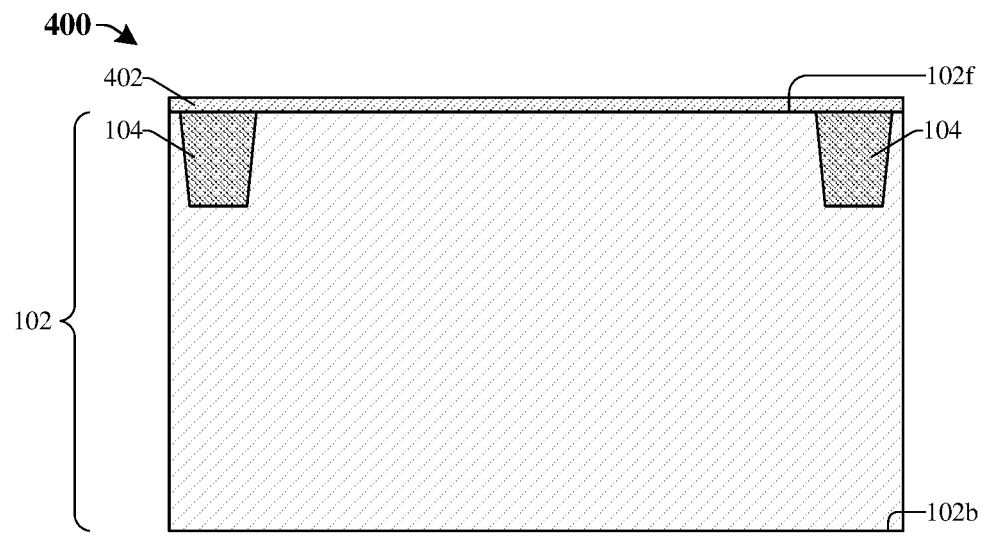
FIGS. 4-14 illustrate cross-sectional views of some embodiments of a first method of forming an image sensor including a capping structure along an image sensor element.

As illustrated in the cross-sectional view 400 of FIG. 4, a substrate 102 is provided and a first isolation structure 104 is formed within the substrate 102. In some embodiments, the substrate 102 may, for example, be or comprise a bulk substrate (e.g., a bulk silicon substrate), a silicon-on-insulator (SOI) substrate, or some other suitable substrate. In further embodiments, the first isolation structure 104 may be formed by selectively etching the substrate 102 to form a trench in the substrate 102, and subsequently filling (e.g., by chemical vapor deposition (CVD), physical vapor deposition (PVD), atomic layer deposition (ALD), or another suitable deposition or growth process) the trench with a dielectric material. In yet further embodiments, the substrate 102 is selectively etched by forming a masking layer (not shown) over a front-side surface 102f of the substrate 102, and subsequently exposing the substrate 102 to one or more etchants configured to selectively remove unmasked portions of the substrate 102. In some embodiments, the dielectric material may, for example, be or comprise an oxide (e.g., silicon dioxide), a nitride (e.g., silicon nitride), a carbide (e.g., silicon carbide), another dielectric material, or any combination of the foregoing. Further, an upper dielectric layer 402 is deposited over the substrate 102. The upper dielectric layer 402 may, for example, be or comprise silicon dioxide, undoped silicon glass (USG), another suitable material, or any combination of the foregoing. In further embodiments, the upper dielectric layer 402 may be deposited by ALD, CVD, PVD, or another suitable growth or deposition process.

Figure 5:
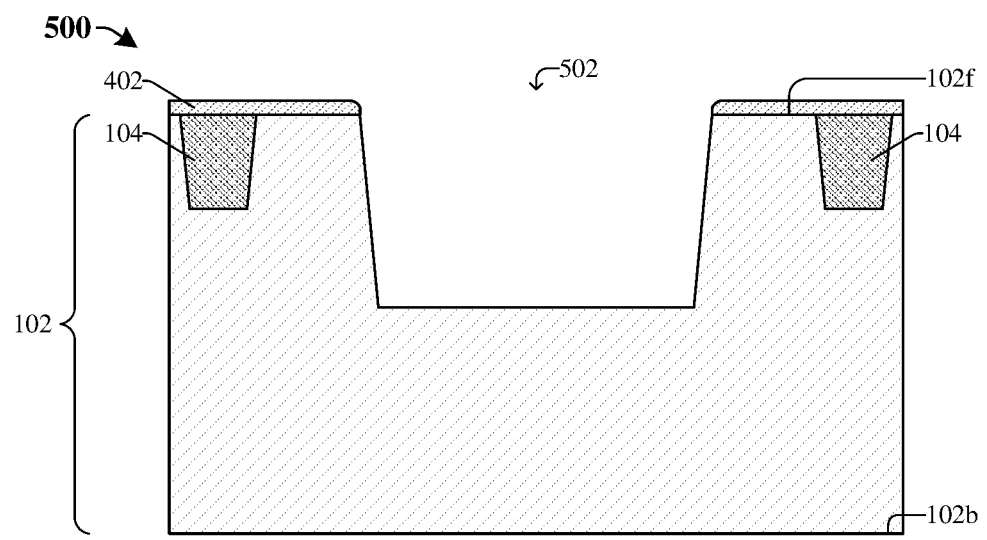

As illustrated in the cross-sectional view 500 of FIG. 5, a patterning process is performed on the substrate 102, thereby forming an opening 502 within the substrate 102. In some embodiments, the patterning process includes: forming a masking layer (not shown) over the substrate 102; and exposing the substrate 102 to one or more etchants, thereby removing unmasked regions of the substrate 102 and forming the opening 502. Subsequently, a removal process may be performed to remove the masking layer. In yet further embodiments, the patterning process may include performing a wet etch process, a dry etch process, another suitable etch process, or any combination of the foregoing.

Figure 6:
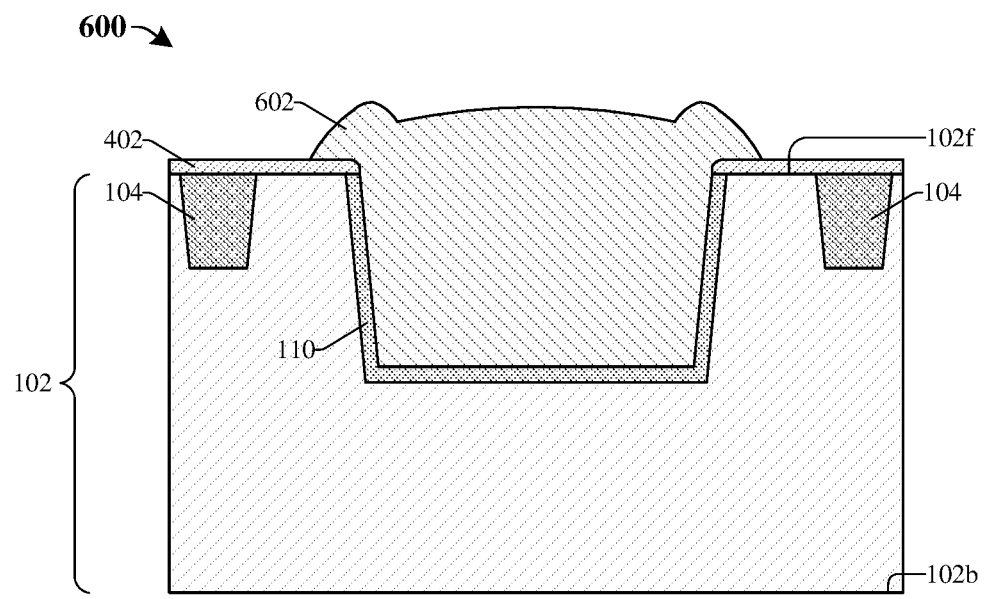

As illustrated in the cross-sectional view 600 of FIG. 6, a buffer layer 110 is selectively formed along sidewalls and a lower surface of the substrate 102. Further, an active structure 602 is selectively formed over the buffer layer 110, thereby filling the opening (502 of FIG. 5). In some embodiments, the buffer layer 110 and/or the active structure 602 may, for example, be formed by molecular-beam epitaxy (MBE), vapor-phase epitaxy (VPE), liquid-phase epitaxy (LPE), some other suitable epitaxial process, or another suitable growth or deposition process. In yet further embodiments, the buffer layer 110 may act as a seed layer for the formation of the active structure 602.

In some embodiments, the buffer layer 110 may, for example, be or comprise silicon germanium, another suitable material, or any combination of the foregoing. In further embodiments, the buffer layer 110 is comprised of a first material (e.g., silicon) and a second material (e.g., germanium) such that a concentration of the first material continuously decreases from an inner surface of the substrate 102 to an outer surface of the active structure 602 and a concentration of the second material continuously increases from the inner surface of the substrate 102 to the outer surface of the active structure 602. In some embodiments, the active structure 602 may, for example, be or comprise the second material (e.g., germanium), another suitable material, or any combination of the foregoing.

Figure 7:
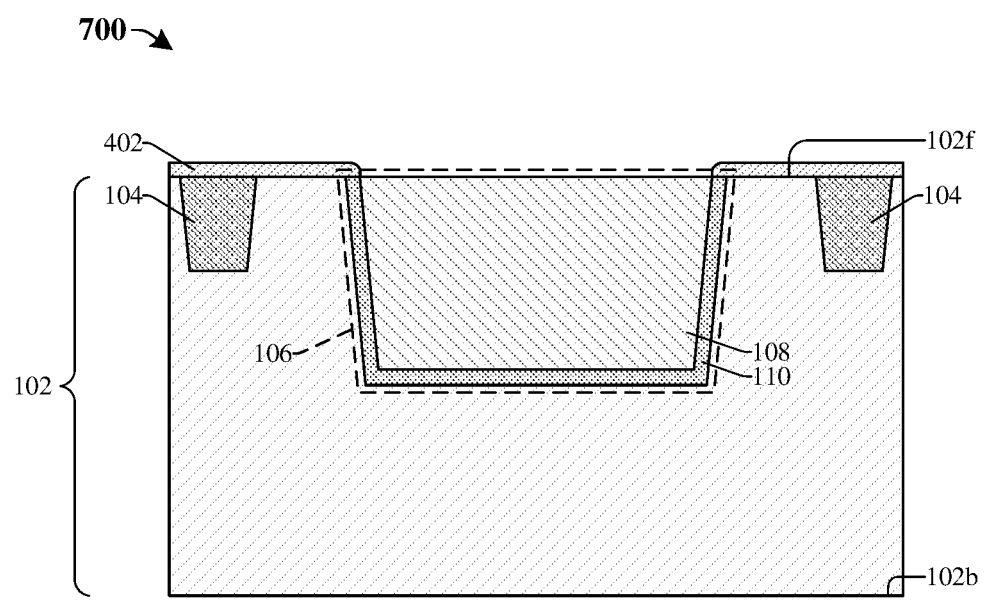

As illustrated in the cross-sectional view 700 of FIG. 7, a planarization process (e.g., a chemical mechanical planarization (CMP) process) is performed on the active structure (602 of FIG. 6), thereby forming an active layer 108 and an image sensor element 106. In some embodiments, during the planarization process, the active structure (602 of FIG. 6) is removed more quickly than the upper dielectric layer 402 such that a top surface of the active layer 108 is disposed below a top surface of the upper dielectric layer 402. Further, the planarization process may be performed such that the top surface of the active layer 108 is aligned with the front-side surface 102f of the substrate 102. In addition, forming the image sensor element 106 may include performing one or more forming processes (e.g., include selective ion implantation processes, or other suitable processing steps) to define well region(s), doped region(s), or other suitable regions and/or structures within the active layer 108. For example, the one or more forming processes may be performed to form the second deep well 322, the first heavily doped region 324, and/or the first deep well 326 of FIG. 3B in the active layer 108.

Figure 8:
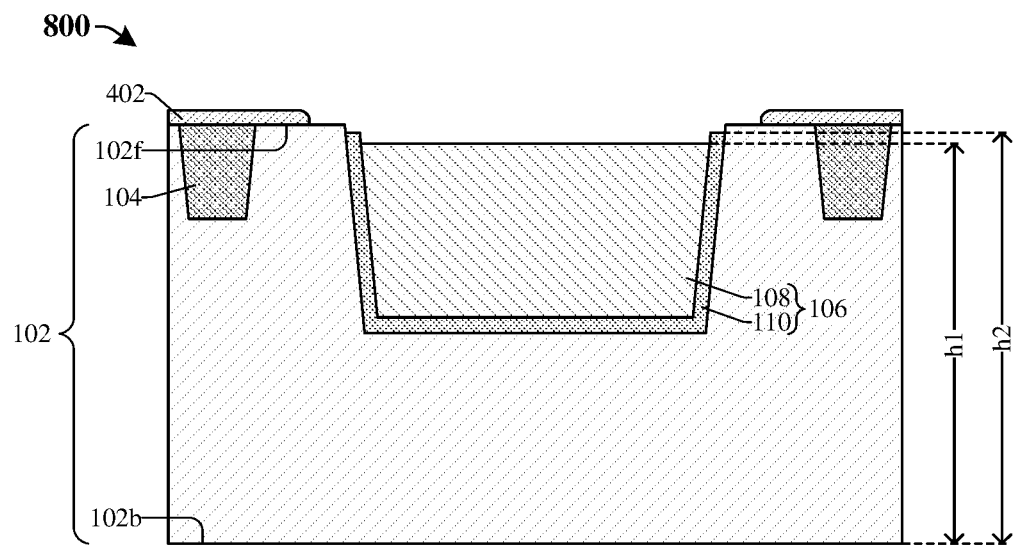

As illustrated in the cross-sectional view 800 of FIG. 8, an etch-back process is performed on the upper dielectric layer 402, thereby removing a portion of the upper dielectric layer 402 from the front-side surface 102f of the substrate 102. In some embodiments, the etch-back process includes performing a wet etch process and/or exposing the structure of FIG. 7 to one or more etchants, and forming a masking layer (not shown) over the upper dielectric layer 402. The one or more etchants may, for example, be or comprise hydrofluoric acid (HF), another etchant, or any combination of the foregoing. During the etch-back process, the upper dielectric layer 402 is etched at a first etching rate, the buffer layer 110 is etched at a second etching rate, and the active layer 108 is etched at a third etching rate. In some embodiments, the first etching rate is greater than the second and third etching rates, such that the upper dielectric layer 402 is removed more quickly than the buffer layer 110 and/or the active layer 108 during the etch-back process. For example, the first etching rate may be about 90 Angstroms/minute or another suitable value and the third etching rate may be about 1.4 Angstroms/minute or another suitable value. In yet further embodiments, the third etching rate may be greater than the second etching rate.

In addition, after the etch-back process, a height h1 of the active layer 108 is defined between a back-side surface 102b of the substrate 102 and a top surface of the active layer 108, and a height h2 of the buffer layer 110 is defined between the back-side surface 102b of the substrate 102 and a top surface of the buffer layer 110. In some embodiments, the height h1 is less than the height h2. It will be appreciated that in some embodiments, the etch-back process of FIG. 8 may be omitted and/or skipped, such that the first method may flow from FIGS. 4-7 to 9-13 (i.e., skipping the processing step of FIG. 8).

Figure 9:
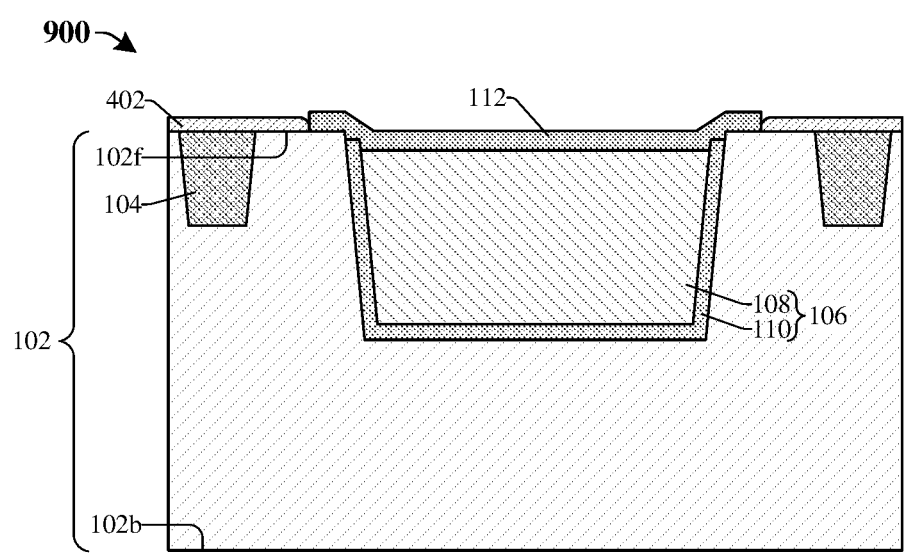

As illustrated in the cross-sectional view 900 of FIG. 9, a capping structure 112 is formed over the image sensor element 106 and the substrate 102. Before forming the capping structure 112, a cleaning process is performed on the substrate 102, the active layer 108, and the buffer layer 110. The cleaning process may include exposing the structure of FIG. 8 to one or more chemicals, thereby cleaning (e.g., removing impurities and/or other materials) a surface of the substrate 102, the active layer 108, and the buffer layer 110. The one or more chemicals may, for example, be or comprise hydrofluoric acid (HF), deionized (DI) water, another suitable chemical, or any combination of the foregoing. The capping structure 112 is formed in such a manner that it continuously extends along the top surface of the active layer 108 and the top surface of the buffer layer 110. Further, the capping structure 112 continuously covers and extends over outer edges of the image sensor element 106. In some embodiments, the capping structure 112 is formed, for example, by CVD, PVD, ALD, MBE, VPE, LPE, some other suitable epitaxial process, or another suitable growth or deposition process. In some embodiments, the capping structure 112 may, for example, be or comprise silicon, epitaxial silicon, amorphous silicon, crystalline silicon, a high-k dielectric material such as aluminum oxide, hafnium oxide, another suitable material, or any combination of the foregoing. Subsequently, a removal process is performed to remove the upper dielectric layer 402 (not shown).

Figure 10:
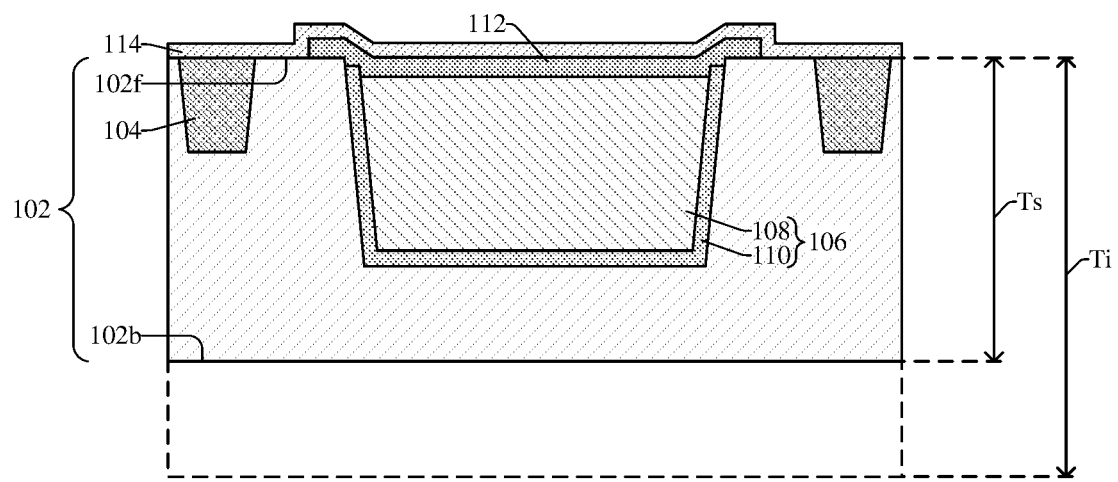

As illustrated in the cross-sectional view 1000 of FIG. 10, a dielectric layer 114 is formed over the capping structure 112 and the substrate 102. The dielectric layer 114 may, for example, be deposited by CVD, ALD, PVD, or another suitable growth or deposition process. In some embodiments, the dielectric layer 114 may, for example, be or comprise an oxide, such as silicon dioxide, another suitable material, or any combination of the foregoing. Subsequently, a thinning process is performed on the back-side surface 102b of the substrate 102 to reduce an initial thickness Ti of the substrate 102 to a thickness Ts. The thickness Ts is defined between the front-side surface 102f of the substrate 102 and the back-side surface 102b of the substrate 102. In some embodiments, the thinning process may include performing a mechanical grinding process, a CMP process, another suitable thinning process, or any combination of the foregoing.

Figure 11:
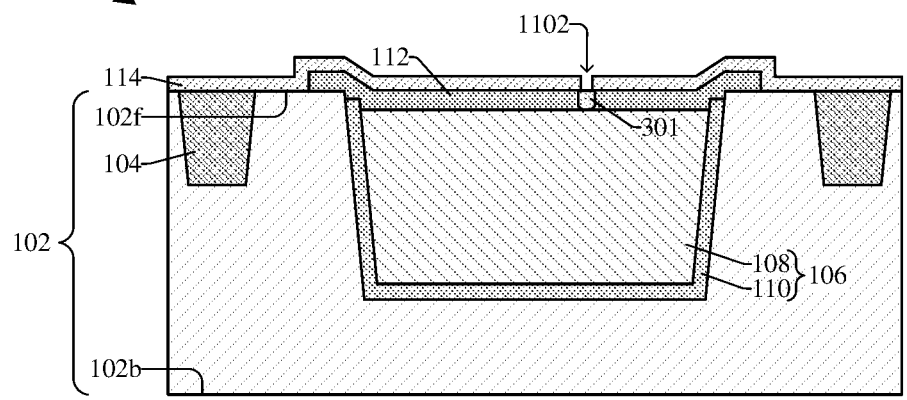

As illustrated in the cross-sectional view 1100 of FIG. 11, a patterning process is performed on the dielectric layer 114 to define an opening 1102. In some embodiments, the patterning process may include exposing the dielectric layer 114 to one or more etchants according to a photomask (not shown) and/or a masking layer (not shown), thereby forming the opening 1102. The opening 1102 may expose an upper surface of the capping structure 112. Subsequently, a silicide layer 301 is formed within the capping structure 112 and directly overlies the active layer 108. In some embodiments, the silicide layer 301 directly overlies a doped region (not shown) of the active layer 108 and is electrically coupled to the doped region. In further embodiments, the silicide layer 301 may, for example, be or comprise nickel silicide, cobalt silicide, titanium silicide, another suitable material, or any combination of the foregoing.

In yet further embodiments, a process for forming the silicide layer 301 includes: depositing (e.g., by sputtering, electroless plating, electro plating, PVD, CVD, or another suitable growth or deposition process) a conductive layer (e.g., comprising nickel, titanium, cobalt, or another conductive material) over the capping structure 112, thereby filling the opening 1102; performing a rapid thermal anneal on the conductive layer to form the silicide layer 301 within the capping structure 112; and performing a removal process (e.g., a wet etch process) to remove material from the conductive layer that was not converted to the silicide layer 301. The removal process includes exposing the structure of FIG. 11 to one or more reactive etchants (e.g., hydrogen peroxide (e.g., $H_2O_2$)). In some embodiments, if the one or more reactive etchants came in contact with a second material (e.g., germanium) of the active layer 108 it may form a compound of the second material and the reactive etchant. The compound may be prone to diffusing away from the active layer 108 to adjacent structures and/or layers. In such embodiments, the diffusion of the compound may result in a formation of voids within the active layer 108, thereby decreasing a structural integrity and/or performance of the image sensor element 106. The compound may, for example, be or comprise germanium oxide ($GeO_2$), $H_2GeO_3$, another chemical compound, or any combination of the foregoing. By virtue of the capping structure 112 continuously extending over and covering outer edges of the active layer 108 and outer edges of the buffer layer 110, the one or more reactive etchants may not reach and/or react with the active layer 108 during the removal process. This in turn mitigates the formation of voids within the active layer 108, thereby increasing an endurance, reliability, and overall performance of the image sensor element 106.

It will be appreciated that one or more additional silicide layers (not shown) may be formed within the substrate 102, such that the capping structure 112 is configured to protect the active layer 108 during formation of the one or more additional silicide layers. In yet further embodiments, formation of the silicide layer 301 within the capping structure 112 may be omitted.

Figure 12:
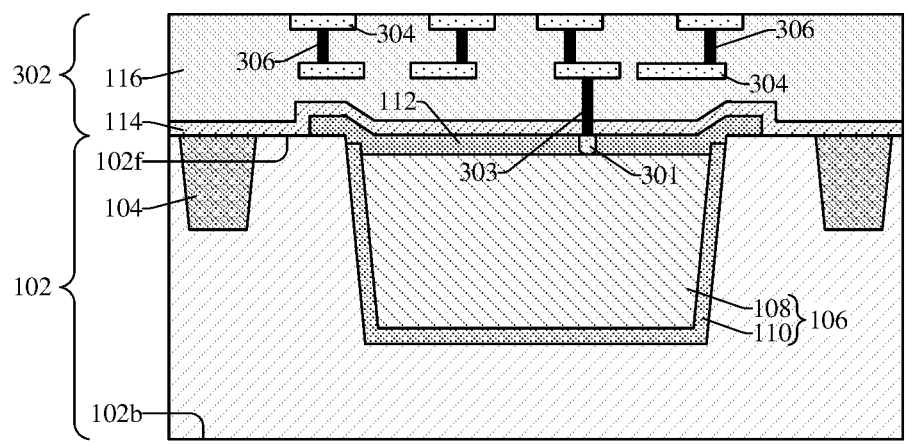

As illustrated in the cross-sectional view 1200 of FIG. 12, an interconnect structure 302 is formed over the front-side surface 102f of the substrate 102. The interconnect structure includes a dielectric structure 116, a conductive contact 303, a plurality of conductive wires 304, and a plurality of conductive vias 306. In some embodiments, the dielectric structure 116 may, for example, be or comprise oxide (e.g., silicon dioxide), a nitride (e.g., silicon nitride), a low-k dielectric material, another suitable dielectric material, or any combination of the foregoing. The dielectric structure 116 may be formed by one or more deposition processes (e.g., CVD, PVD, ALD, or another suitable deposition or growth process). The conductive contact 303, the plurality of conductive wires 304, and/or the plurality of conductive vias 306 may, for example, be formed by a single damascene process, a dual damascene process, or another suitable formation process. In some embodiments, the conductive contact 303, the plurality of conductive wires 304, and/or the plurality of conductive vias 306 may, for example, respectively be or comprise aluminum, copper, titanium nitride, tantalum nitride, ruthenium, another conductive material, or any combination of the foregoing. In further embodiments, the conductive contact 303 overlies the silicide layer 301 and is electrically coupled to the image sensor element 106 via the silicide layer 301.

Figure 13:
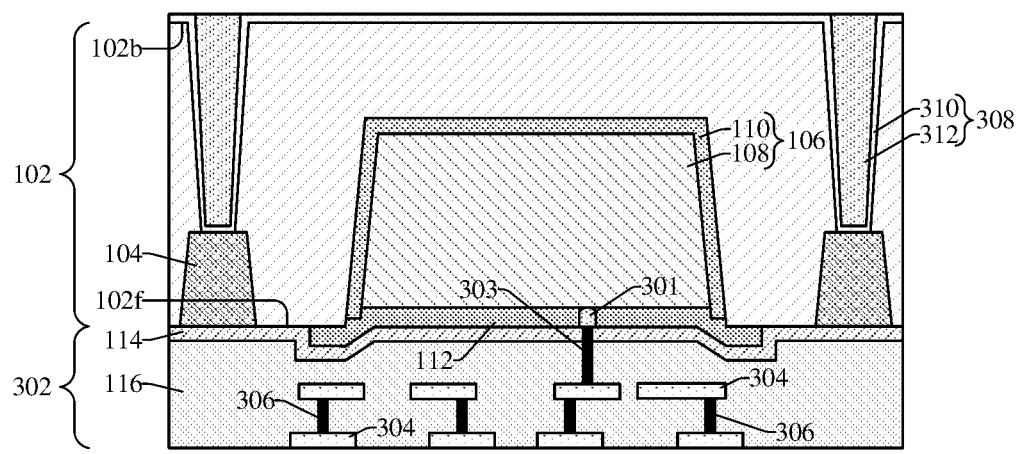

As illustrated in the cross-sectional view 1300 of FIG. 13, the structure of FIG. 12 is flipped and a second isolation structure 308 is formed into the back-side surface 102b of the substrate 102. In various embodiments, the second isolation structure 308 may be configured as a deep trench isolation (DTI) structure and/or may include a passivation layer 310 and a trench layer 312. In some embodiments, a process for forming the second isolation structure 308 includes: patterning the back-side surface 102b of the substrate 102, thereby forming DTI openings (not shown) that extend into the back-side surface 102b of the substrate; depositing (e.g., by CVD, PVD, ALD, or another suitable deposition or growth process) the passivation layer 310 over the substrate 102, thereby lining the DTI openings; deposition (e.g., by CVD, PVD, electroless plating, sputtering, electro plating, or another suitable deposition or growth process) a trench material (e.g., aluminum, tungsten, copper, another material, or any combination of the foregoing) over the back-side surface 102b of the substrate, thereby filling the DTI openings; and performing a planarization process into the trench material, thereby forming the trench layer 312 and the second isolation structure 308. In some embodiments, the passivation layer 310 may, for example, be or comprise a dielectric material, such as silicon dioxide, silicon oxynitride, silicon oxycarbide, another suitable dielectric material, or any combination of the foregoing.

Figure 14:
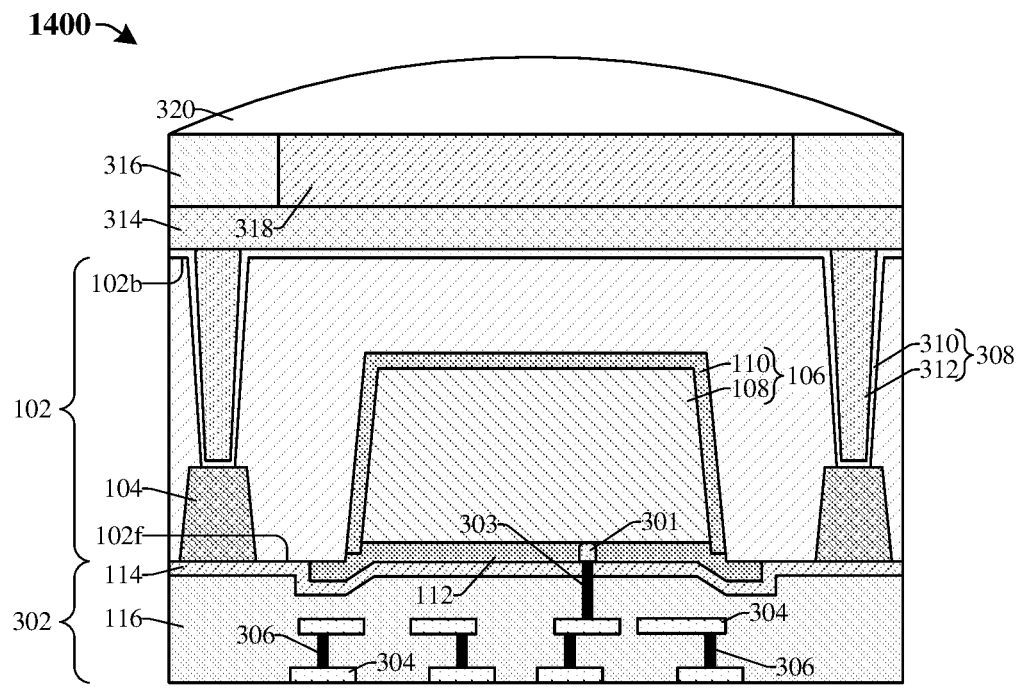

As illustrated in the cross-sectional view 1400 of FIG. 14, an anti-reflective coating (ARC) structure 314 is formed over the back-side surface 102b of the substrate 102. In some embodiments, the ARC structure 314 may, for example, be deposited by CVD, PVD, ALD, or another suitable deposition or growth process. Further, a grid structure 316 is formed over the ARC structure 314. The grid structure 316 may comprise a metal grid structure and/or a dielectric grid structure. In some embodiments, the metal grid structure and/or the dielectric grid structure may be formed by, for example, CVD, PVD, ALD, sputter, electroless plating, or another suitable deposition or growth process. Further, after depositing the metal grid structure and/or the dielectric grid structure, a patterning process is performed on the metal grid structure and/or the dielectric grid structure to define an opening that directly overlies the image sensor element 106. Subsequently, a light filter 318 (e.g., a color filter, an IR filter, etc.) is formed within the opening and over the ARC structure 314. The light filter 318 is formed of material that allows for the transmission of incident electromagnetic radiation (e.g., light) having a specific wavelength range, while blocking incident wavelength with another wavelength outside of the specified range. In further embodiments, the light filter 318 may be formed by CVD, PVD, ALD, sputtering, or the like and/or may be planarized (e.g., via a chemical mechanical planarization (CMP) process) subsequent to formation. In addition, a micro-lens 320 is formed over the light filter 318 and the grid structure 316. In some embodiments, the micro-lens 320 may be formed by depositing (e.g., by CVD, PVD, etc.) a lens material on the light filter 318. A lens template (not shown) having a curved upper surface is patterned above the lens material. The micro-lens 320 is then formed by selectively etching the lens material according to the lens template.

FIGS. 15-17B illustrate cross-sectional views 1500-1700b of some embodiments of a second method of forming an integrated chip having a capping structure that continuously extends over outer edges of an image sensor element according to the present disclosure. Although the cross-sectional views 1500-1700b shown in FIGS. 15-17B are described with reference to a second method, it will be appreciated that the structures shown in FIGS. 15-17B are not limited to the second method but rather may stand alone separate of the second method. Furthermore, although FIGS. 15-17B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

The second method of FIGS. 15-17B may illustrate some alternative embodiments of the first method of FIGS. 4-14. For example, FIGS. 15-17B illustrate cross-sectional views 1500-1700b of some embodiments of acts that may be performed in place of the acts at FIGS. 8-9, such that the first method of FIGS. 4-16 may alternatively proceed from FIGS. 4-7 to FIGS. 15-17B and then from FIG. 17A or 17B to FIGS. 10-14 (skipping FIGS. 8-9).

Figure 15:
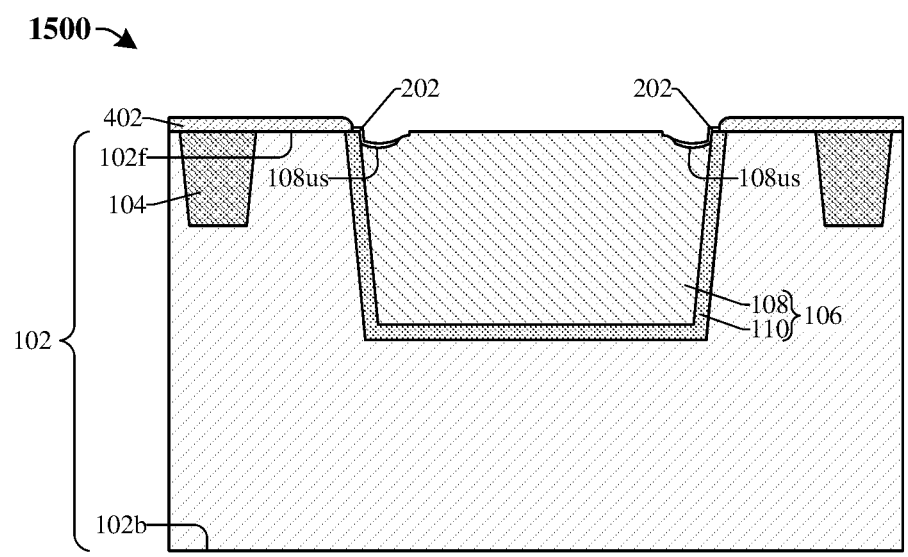
FIGS. 15-17B illustrate cross-sectional views of some embodiments of a second method of forming an image sensor including a capping structure along an image sensor element.

As illustrated in cross-sectional view 1500 of FIG. 15, an oxide layer 202 may form along an upper surface 108us of the active layer 108. In some embodiments, the upper surface 108us may be curved and may be formed as a result of the planarization process performed in FIG. 7. In further embodiments, the oxide layer 202 may extend from a top surface of the buffer layer 110, along a sidewall of the buffer layer 110, to the upper surface 108us of the active layer 108. In some embodiments, the oxide layer 202 may, for example, be or comprise an oxide of the second material, such as germanium oxide (e.g., $GeO_2$), or another material.

Figure 16:
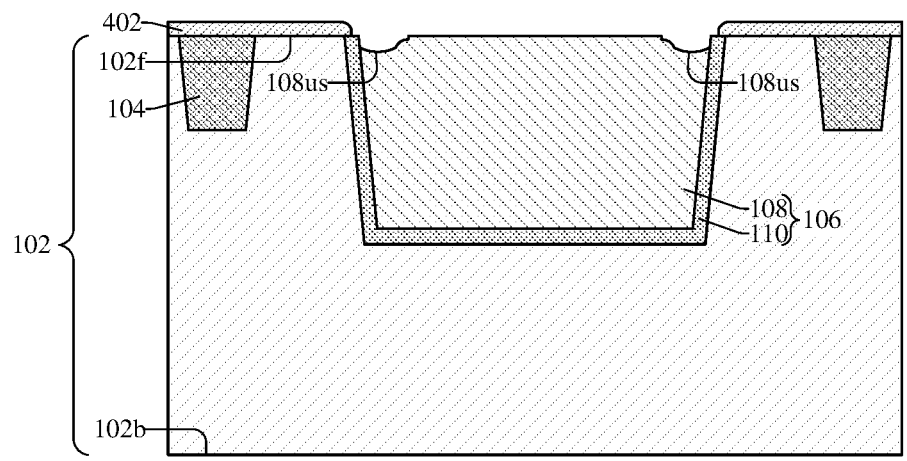

As illustrated in cross-sectional view 1600 of FIG. 16, a removal process is performed to remove the oxide layer (202 of FIG. 15). In some embodiments, the removal process includes exposing the structure of FIG. 15 to one or more etchants (e.g., $H_2O_2$) that are configured to remove the oxide layer (202 of FIG. 15). In further embodiments, the removal process may include performing a baking process on the structure of FIG. 15 with a chemical (e.g., hydrogen ($H_2$)) configured to remove the oxide layer (202 of FIG. 15). Thus, the removal process is configured to remove the oxide layer (202 of FIG. 15) from the upper surface 108us of the active layer 108.

Figure 17A:
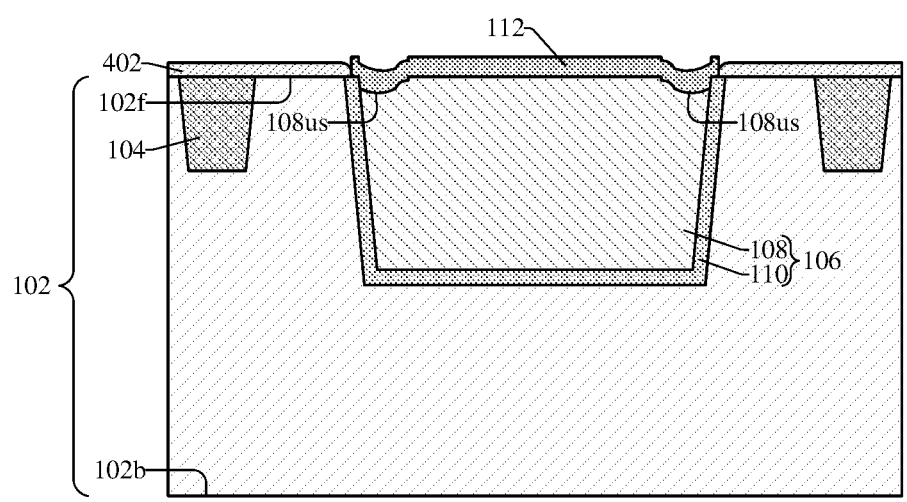

As illustrated in cross-sectional view 1700a of FIG. 17A, a capping structure 112 is formed over the active layer 108 and the substrate 102. The capping structure 112 is formed in such a manner that it continuously extends along the top surface of the active layer 108 and covers outer edges of the active layer 108. In some embodiments, the capping structure 112 is formed, for example, by CVD, PVD, ALD, MBE, VPE, LPE, some other suitable epitaxial process, or another suitable growth or deposition process. Subsequently, a removal process may be performed to remove the upper dielectric layer 402 (not shown).

Figure 17B:
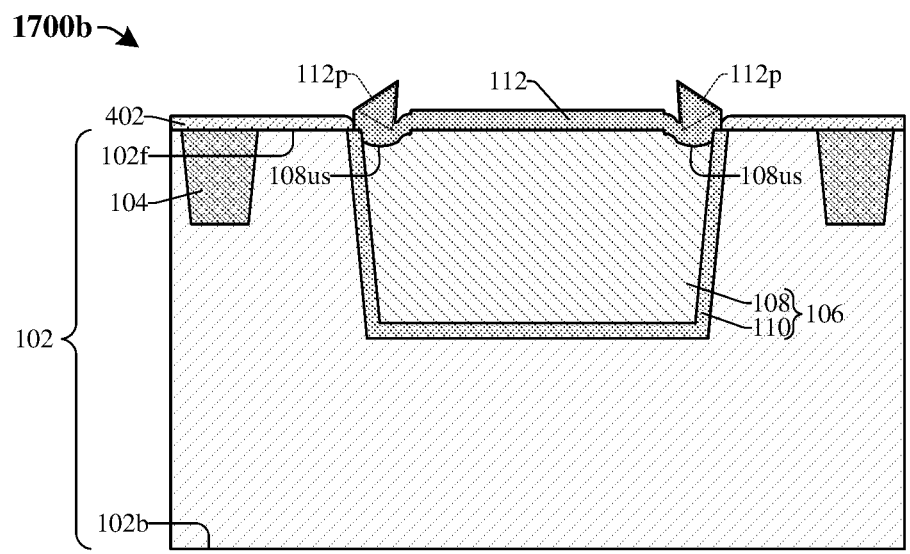

FIG. 17B illustrates a cross-sectional view 1700b of some alternative embodiments of the processing steps of cross-sectional view 1700a of FIG. 17A. As illustrated in cross-sectional view 1700b of FIG. 17B, the capping structure 112 may be formed in such a manner that it comprises protrusions 112p that directly overlie the outer edges of the active layer 108. The capping structure 112 may be formed, for example, by CVD, PVD, ALD, MBE, VPE, LPE, some other suitable epitaxial process, or another suitable growth or deposition process.

Figure 18:
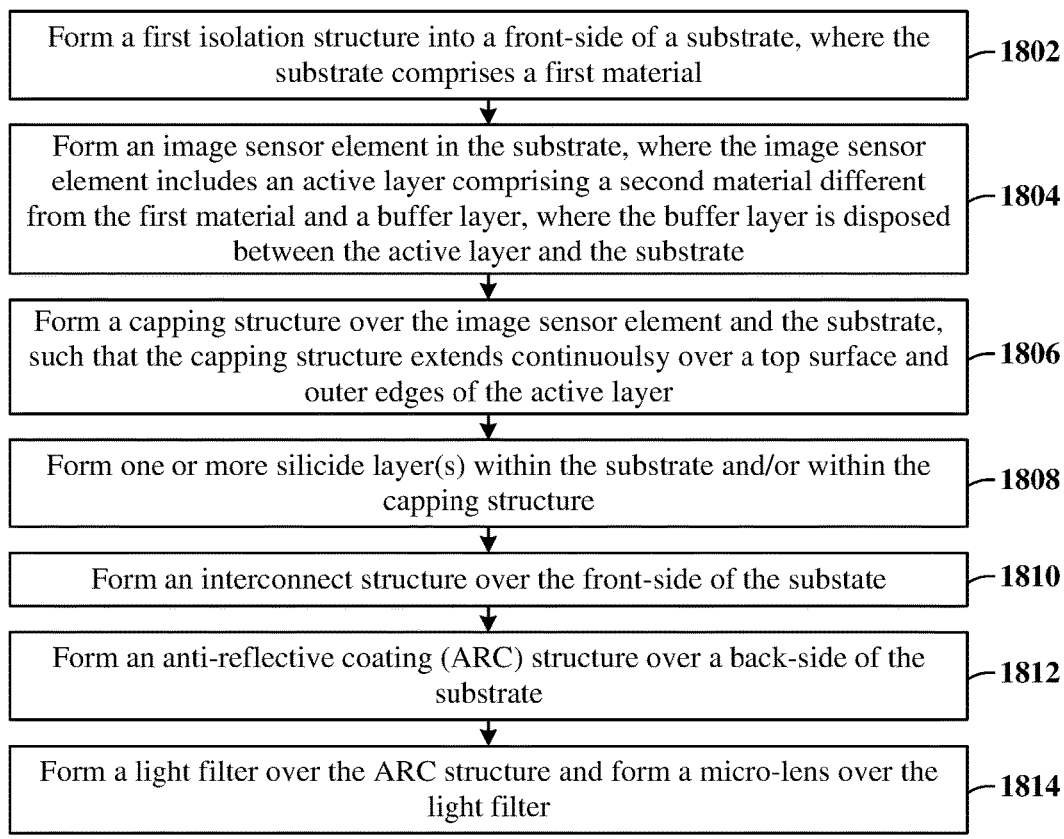
FIG. 18 illustrates a methodology in flowchart format that illustrates some embodiments of forming an image sensor including a capping structure along an image sensor element.

FIG. 18 illustrates a method 1800 of forming an image sensor including a capping structure along an image sensor element according to the present disclosure. Although the method 1800 is illustrated and/or described as a series of acts or events, it will be appreciated that the method 1800 is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1802, a first isolation structure is formed into a front-side of a substrate, where the substrate comprises a first material. FIG. 4 illustrates a cross-sectional view 400 corresponding to some embodiments of act 1802.

At act 1804, an image sensor element is formed in the substrate, where the image sensor element includes an active layer comprises a second material different from the first material and a buffer layer. The buffer layer is disposed between the active layer and the substrate. FIGS. 5-8 illustrate cross-sectional views 500-800 corresponding to some embodiments of act 1804.

At act 1806, a capping structure is formed over the image sensor element and the substrate, such that the capping structure extends continuously over a top surface and outer edges of the active layer. FIG. 9 illustrates a cross-sectional view 900 corresponding to some embodiments of act 1806. FIGS. 17A and 17B illustrate cross-sectional views 1700a and 1700b corresponding to some alternative embodiments of act 1806.

At act 1808, one or more silicide layer(s) is/are formed within the substrate and/or within the capping structure. FIG. 11 illustrates a cross-sectional view 1100 corresponding to some embodiments of act 1808.

At act 1810, an interconnect structure is formed over the front-side of the substrate. FIG. 12 illustrates a cross-sectional view 1200 corresponding to some embodiments of act 1810.

At act 1812, an anti-reflective coating (ARC) structure is formed over a back-side of the substrate. FIG. 14 illustrates a cross-sectional view 1400 corresponding to some embodiments of act 1812.

At act 1814, a light filter is formed over the ARC structure and a micro-lens is formed over the light filter. FIG. 14 illustrates a cross-sectional view 1400 corresponding to some embodiments of act 1814.

Accordingly, in some embodiments, the present disclosure relates to an image sensor element disposed within a substrate, where the image sensor element comprises an active layer. A capping structure continuously extends over a top surface of the active layer and overlies outer edges of the active layer.

In some embodiments, the present application provides an image sensor including: a substrate comprising a first material; an image sensor element disposed within the substrate, wherein the image sensor element includes an active layer comprising a second material different from the first material; a buffer layer disposed between the active layer and the substrate, wherein the buffer layer extends along outer sidewalls and a bottom surface of the active layer; and a capping structure overlying the active layer, wherein the outer sidewalls of the active layer are spaced laterally between outer sidewalls of the capping structure such that the capping structure continuously extends over outer edges of the active layer.

In some embodiments, the present application provides an integrated chip including: a substrate comprising a first material, wherein the substrate comprises opposing sidewalls and a lower surface defining a trench that extends into a front-side surface of the substrate; an active layer disposed within the trench, wherein the active layer comprises a second material different from the first material; a buffer layer lining the trench such that the buffer layer is disposed between the substrate and the trench, wherein the buffer layer comprises a compound of the first material and the second material; a capping structure continuously extending over the active layer and the buffer layer, wherein the capping structure directly overlies the opposing sidewalls of the substrate that define the trench, wherein the capping structure comprises the first material; and a silicide layer disposed within the capping structure.

In some embodiments, the present application provides a method for forming an image sensor, the method includes: forming a dielectric layer along a surface of a substrate, wherein the substrate comprises a first material; etching the dielectric layer and the substrate to define a trench within the substrate; forming a buffer layer within the trench such that the dielectric layer contacts the buffer layer; forming an active layer within the trench, wherein the active layer comprises a second material different from the first material; and forming a capping structure over the active layer such that the capping structure continuously extends along a top surface of the active layer, wherein the capping structure comprises the first material, and wherein the capping structure directly overlies uppermost edges of the active layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor, comprising:
   forming a dielectric layer along a surface of a substrate, wherein the substrate comprises a first material;
   etching the dielectric layer and the substrate to define a trench within the substrate;
   forming a buffer layer within the trench such that the dielectric layer contacts the buffer layer;
   forming an active layer within the trench, wherein the active layer comprises a second material different from the first material; and
   forming a capping structure over the active layer such that the capping structure continuously extends along a top surface of the active layer to the surface of the substrate, wherein the capping structure comprises the first material, wherein the capping structure overlies uppermost edges of the active layer, and wherein the capping structure directly contacts the top surface of the active layer and the surface of the substrate.

2. The method of claim 1, further comprising:
performing an etch-back process on the dielectric layer such that the dielectric layer is laterally offset from the buffer layer by a non-zero distance, wherein the dielectric layer is etched more quickly than the active layer during the etch-back process.

3. The method of claim 2, wherein the etch-back process comprises performing a wet etch.

4. The method of claim 2, wherein after the etch-back process, a height of the active layer is less than a height of the buffer layer.

5. The method of claim 2, wherein the active layer is etched more quickly than the buffer layer during the etch-back process.

6. The method of claim 1, wherein the capping structure, the active layer, and the buffer layer are respectively formed by an epitaxial process.

7. The method of claim 1, further comprising:
forming a silicide layer within the capping structure such that the silicide layer directly overlies the active layer, wherein the silicide layer comprises a compound of the first material and a conductive material.

8. The method of claim 1, wherein a width of the capping structure is greater than a width of the buffer layer.

9. The method of claim 1, wherein the first material comprises silicon and the second material comprises germanium.

10. The method of claim 1, wherein the capping structure directly contacts a top surface of the buffer layer.

11. A method for forming an image sensor, comprising:
depositing a dielectric layer along a first surface of a substrate;
etching the dielectric layer and the substrate to define an opening extending into the first surface of the substrate;
forming a buffer layer lining the opening;
forming an active layer over the buffer layer and filling the opening;
performing a planarization process on the active layer to reduce a thickness of the active layer;
performing an etch-back process on the dielectric layer, the buffer layer, and the active layer, wherein after the etch-back process the dielectric layer is laterally offset from the active layer by a lateral distance, wherein the planarization process is performed before the etch-back process; and
forming a capping structure over the active layer, wherein the capping structure continuously extends from the first surface of the substrate to a top surface of the active layer.

12. The method of claim 11, wherein the lateral distance is greater than a thickness of the dielectric layer.

13. The method of claim 11, wherein the capping structure directly contacts the dielectric layer.

14. The method of claim 11, wherein during the etch-back process the dielectric layer is etched at a first rate, the buffer layer is etched at a second rate, and the active layer is etched at a third rate, wherein the first rate is greater than the second rate and the third rate.

15. The method of claim 14, wherein the third rate is greater than the second rate.

16. The method of claim 11, further comprising:
forming an interconnect structure along the first surface of the substrate;
forming an isolation structure extending into a second surface of the substrate, wherein the isolation structure laterally wraps around the active layer, wherein the first surface is opposite the second surface; and
forming a light filter on the second surface, wherein the active layer is spaced between sidewalls of the light filter.

17. A method for forming an image sensor, comprising:
depositing a dielectric layer on a surface of a substrate;
etching the dielectric layer and the substrate to define an opening in the substrate, wherein the dielectric layer comprises opposing sidewalls that at least partially defining the opening;
forming an active layer in the opening, wherein the active layer contacts the opposing sidewalls of the dielectric layer;
performing an etch-back process on the dielectric layer and the active layer, wherein the etch-back process expands a distance between the opposing sidewalls of the dielectric layer, wherein the etch-back process reduces a height of the active layer to less than a height of the opening; and
forming a capping structure on the active layer, wherein the capping structure contacts the opposing sidewalls of the dielectric layer.

18. The method of claim 17, further comprising:
performing a cleaning process on the active layer and the substrate before forming the capping structure.

19. The method of claim 17, further comprising:
forming a buffer layer between the substrate and the active layer, wherein the capping structure contacts a top surface of the buffer layer.

20. The method of claim 17, further comprising:
forming a silicide layer in the capping structure; and
forming an interconnect structure on the surface of the substrate, wherein the interconnect structure is electrically coupled to the active layer by way of the silicide layer.

* * * * *